United States Patent [19]

Kopatz et al.

[11] Patent Number: 4,760,711

[45] Date of Patent: Aug. 2, 1988

[54] MULTILAYER COOLING DISC FOR USE IN HIGH TEMPERATURE PROCESSING

[75] Inventors: Nelson E. Kopatz, Sayre, Pa.; Philip E. Stermer, Waverly, N.Y.

[73] Assignee: GTE Products Corporation, Stamford, Conn.

[21] Appl. No.: 81,050

[22] Filed: Aug. 3, 1987

[51] Int. Cl.[4] ............................................. F25D 17/02
[52] U.S. Cl. ........................................... 62/373; 62/64
[58] Field of Search ..................................... 62/64, 373

[56] References Cited

U.S. PATENT DOCUMENTS

| | | | |
|---|---|---|---|
| 4,110,092 | 8/1978 | Kunioka et al. | 62/64 |
| 4,205,530 | 6/1980 | Soecknick et al. | 62/373 |
| 4,534,177 | 8/1985 | Wooding | 62/64 |

Primary Examiner—Ronald C. Capossela
Attorney, Agent, or Firm—Donald R. Castle; L. Rita Quantrini

[57] ABSTRACT

A disc is disclosed which comprises a top layer, a middle layer, and a bottom layer. The top layer is placed proximate to a high temperature reactor and at least the outer surface of the top layer is made of a material which allows it to act as a substrate against which molten particles are impacted to microatomize the particles. The layers are positioned one above the other with a first space between the bottom surface of the top layer and the top surface of the middle layer, and a second space between the bottom surface of the middle layer and the top surface of the bottom layer. The top and bottom layers are joined together and stabilized by a peripheral wall around the circumferential edge of the top and bottom layer. The middle layer is fixedly mounted to the bottom layer. The middle layer is smaller in diameter than the diameters of the top and bottom layers so that a third space is defined between the inner surface of the peripheral wall and the circumferential edge of the middle layer. The bottom and middle layers have openings through which a cooling fluid passes to the first space to cool the top layer, and thereafter passed by centrifugal force generated by the spinning of the disc and the motion of the fluid through the third space, and exits the disc through the second space. The disc is rotatably mounted to spinning means to allow the disc to spin.

4 Claims, 1 Drawing Sheet

4,760,711

MULTILAYER COOLING DISC FOR USE IN HIGH TEMPERATURE PROCESSING

This invention relates to a multilayered cooling disc for use in high temperature processing, in particular plasma processing. More particularly, the disc is designed to allow it to remain at a relatively cool temperature during the high temperature process thereby resulting in prolonged periods of operation.

BACKGROUND OF THE INVENTION

In plasma processing, various elemental and agglomerated powders are melted using a variety of equipment. Particle shape and/or size can be altered by impinging these molten particles against a substrate and causing them to deform or break apart. This can cause the substrate material which is typically in the form of a spinning flat disc to heat to high temperatures approaching or above that of the melted powder. This minimizes the effect of the substrate and also limits the types of substrates that are usable in such high temperature operations.

The present invention provides a disc which is suitable for use in high temperature processing. The disc has multiple layers and is designed to remain relatively cool during the processing.

SUMMARY OF THE INVENTION

In accordance with one aspect of this invention, there is provided a cooling disc which comprises a top layer, a middle layer, and a bottom layer. The top layer is placed proximate to a high temperature reactor and at least the outer surface of the top layer is made of a material which allows it to act as a substrate against which molten particles are impacted to microatomize the particles. The layers are positioned one above the other with a first space between the bottom surface of the top layer and the top surface of the middle layer, and a second space between the bottom surface of the middle layer and the top surface of the bottom layer. The top and the bottom layers are joined together and stabilized by a peripheral wall around the circumferential edge of the top and the bottom layer. The middle layer is fixedly mounted to the bottom layer. The middle layer is smaller in diameter then the diameters of the top and the bottom layers so that a third space is defined between the inner surface of the peripheral wall and the circumferential edge of the middle layer. The bottom layer and the middle layer have openings through which a cooling fluid passes to the first space to cool the top layer, and thereafter passes by centrifugal force generated by the spinning of the disc and the motion of the fluid through the third space, and exits the disc through the second space. The disc is rotatably mounted to spinning means to allow the disc to spin.

DETAILED DESCRIPTION OF THE INVENTION

For a better understanding of the present invention, together with other and further objects, advantages and capabilities thereof, reference is made to the following disclosure and appended claims in connection with the above described drawings and description of some of the aspects of the invention.

The multilayer disc of the present invention is suitable for use in high temperature processing. The disc is designed to spin and to accept a cooling fluid to keep it at a relatively cool temperature. Molten powder particles exit a high temperature reactor and are impacted against the outer surface or face of the top layer of the disc which serves as the substrate, whereby the particles arecooled and they deform or break apart. The multilayer design with spaces between the layers allows for the passage of the cooling fluid. The design of the disc with the spacing of the layers, serves to keep the disc cool. As a result of this, the disc can be used for prolonged periods without overheating.

Figure 1:
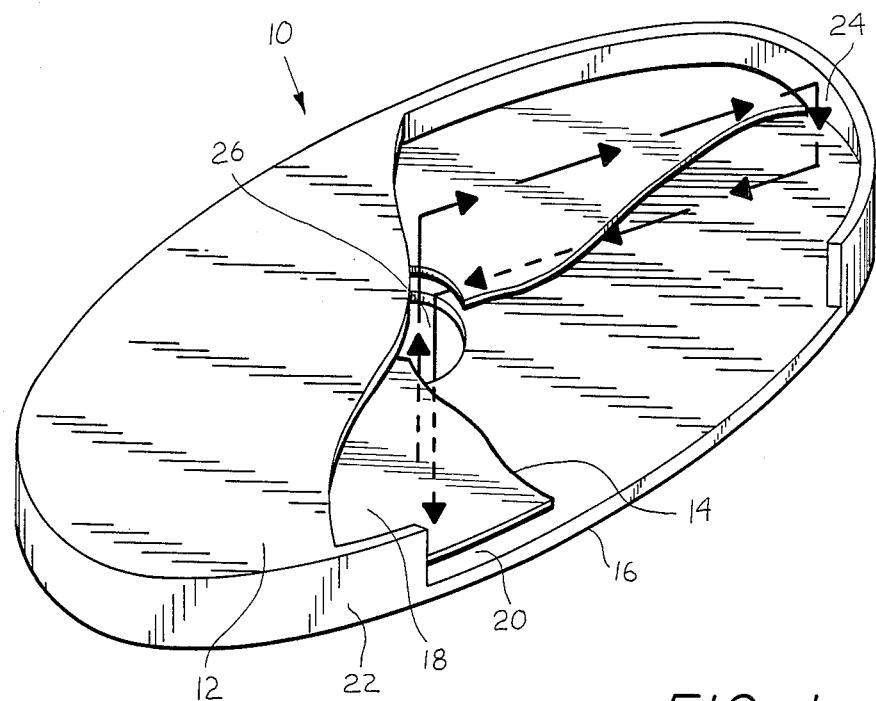
FIG. 1 is a cutaway drawing showing the inside of the cooling disc of the present invention.

Referring now to the drawings, FIG. 1 is a cutaway drawing of the disc of the present invention showing the disc (10) and the top layer (12), middle layer (14) and bottom layer (16). The top layer is placed proximate to a high temperature reactor and at least the outer surface of the top layer is made of a material which allows it to act as a substrate against which molten particles are impacted to microatomize the particles. The layers are positioned one above the other with a first space (18) between the bottom surface of the top layer and the top surface of the middle layer, and a second space (20) between the bottom surface of the middle layer and the top surface of the bottom layer. The top and the bottom layers are joined together and stabilized by a peripheral wall (22) around the circumferential edge of the top and the bottom layers. The middle layer is fixedly mounted to the bottom layer. One preferred mounting arrangement is two or more bolts with spacers to maintain the second space. The middle layer is smaller in diameter than the top and the bottom layers so that a third space (24) is defined between the inner surface of the peripheral wall and the circumferential edge of the middle layer. The bottom layer and the middle layer have openings (26) through a cooling fluid passes to the first space to cool the top layer, and thereafter passes by centrifugal force generated by the spinning of the disc and the motion of the fluid through the third space, and exits the disc through the second space.

Figure 2:
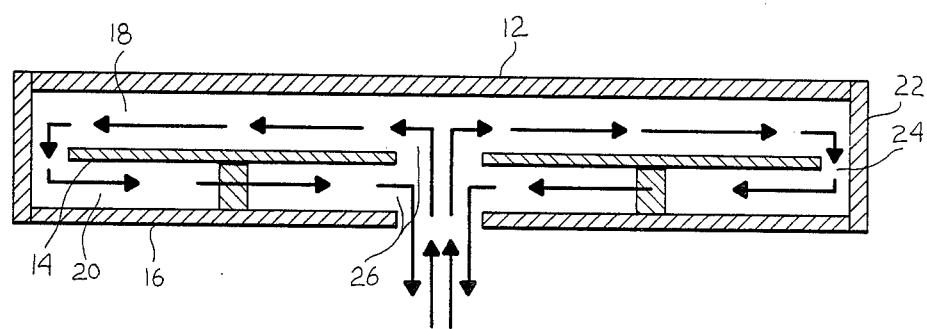
FIG. 2 is a diagram of the cross section of the disc of the present invention.

FIG. 2 is a cross section showing the arrangement of the spaces in the disc and the flow of the cooling fluid as indicated by the arrows.

The disc is rotatably mounted by any mechanical means which will allow it to spin preferably at speeds of about 20,000 rpm. The preferred mounting arrangement is a shaft which is rotatably mounted at the top layer. The shaft is attached to any mechanical means which will allow it to rotate or spin.

In operation, the disc is placed with its top layer proximate to the high temperature reactor. The face of the top layer serves as the substrate against which the molten particles from the high temperature reactor are impacted to allow them to fragment and cool.

Depending on the nature of the powder, or required variations in the process or product, various substrates can be substituted as the top layer. The top layer can be made of a support sub-layer on top of which is the substrate layer against which the molten particles are impacted. One such arrangement is a support of aluminum on top of which is-teflon which serves as the substrate. The support layer can have a number of holes in it or it can be a solid piece. If there is not good contact between the substrate and support layer, it is preferred to have holes in the support layer. The purpose of the holes is to allow contact between the cooling fluid and substrate for more efficient cooling.

Other materials of which the top layer can be made are pyrolytic graphite and pyrolytic boron nitride. In the case of pyrolytic graphite the entire top layer is made of this material and no support layer is needed.

In operation, the cooling fluid enters the inside of the disc by delivery means through the bottom and middle layers. The preferred delivery means is a tube. The fluid passes to the first space to cool the top layer. Thereafter it passes through the third space into the second space and then exits the disc through the opening in the bottom layer. The fluid moves by centrifugal force generated by the spinning of the disc and by the motion of the fluid itself. Flow continues in this manner as a pressure differential exists due to the continual decreasing density of the fluid as it evaporates. The design which allows the fluid to flow in the manner just described allows for an increased contact time of cooling fluid with the disc and therefore the disc stays cool for prolonged periods of time.

The disc of the present invention is especially suitable for use in plasma processing operations. Plasma temperatures are typically in the range of from about 5000° C. to about 17,000° C. One particular application is in microatomization of plasma melted particles.

One especially suitable cooling fluid is liquid nitrogen.

The disc can be of any size that is convenient for the particular processing and the invention is not limited by size relationships of the various parts of the disc. However when used in conjunction with plasma processing, the disc is typically about 8" in diameter and about ¾" high. The compact design and size allow it to be used in confined areas.

The materials of which the layers of the disc are made are chosen so that the disc is able to function in a microatomization process. The disc is hard, non-energy absorbing, non-wetting, and heat dissipating. It must be able to operate in a variety of types of atmospheres, such as vacuum, reducing, or oxidizing atmospheres. The surface of the substrate portion of the disc must be hard enough to withstand the impact of the particles and must allow the particles to be released from it after impact. Because the disc is designed to remain at relatively cool temperatures throughout processing, a wide variety of substrates can be used. Being able to use a wide variety of substrates in the disc allows one to be able to process a wider variety of powders in microatomization processing.

While there has been shown and described what are at present considered the preferred embodiments of the invention, it will be obvious to those skilled in the art that various changes and modifications may be made therein without departing from the scope of the invention as defined by the appended claims.

What is claimed is:

1. A cooling disc rotatably mounted to spinning means to allow said disc to spin, said disc comprising a top layer, a middle layer, and a bottom layer, said top layer being placed proximate to a high temperature reactor and at least the outer surface of which is made of a material which allows it to act as a substrate against which molten particles are impacted to microatomize said particles, said layers being positioned one above the other with a first space between the bottom surface of said top layer and the top surface of said middle layer, and a second space between the bottom surface of said middle layer and the top surface of said bottom layer, said top and said bottom layers being joined together and stabilized by a peripheral wall around the circumferential edge of said top and said bottom layers, said middle layer being fixedly mounted to said bottom layer, said middle layer being smaller in diameter than the diameters of said top and said bottom layers so that a third space is defined between the inner surface of said peripheral wall and the circumferential edge of said middle layer, said bottom layer and said middle layer having openings through which a cooling fluid passes to said first space to cool said top layer, and thereafter passes by centrifugal force generated by the spinning of said disc and the motion of said fluid through said third space, and exits said disc through said second space.

2. A disc of claim 1 wherein said high temperature reactor is a plasma reactor.

3. A disc of claim 1 wherein said material of at least said outer surface of said top layer is selected from the group consisting of teflon, pyrolytic boron nitride, and pyrolytic graphite.

4. A disc of claim 1 wherein said cooling fluid is liquid nitrogen.

* * * * *